(12) United States Patent
Toyoda

(10) Patent No.: US 7,740,898 B2
(45) Date of Patent: *Jun. 22, 2010

(54) METHOD FOR MANUFACTURING ELECTROLUMINESCENCE DEVICE

(75) Inventor: Naoyuki Toyoda, Suwa (JP)

(73) Assignee: Seiko Epson Corporation (JP)

( * ) Notice: Subject to any disclaimer, the term of this patent is extended or adjusted under 35 U.S.C. 154(b) by 1001 days.

This patent is subject to a terminal disclaimer.

(21) Appl. No.: 11/492,543

(22) Filed: Jul. 25, 2006

(65) Prior Publication Data

US 2007/0026138 A1 Feb. 1, 2007

(30) Foreign Application Priority Data

Jul. 26, 2005 (JP) ............................. 2005-216342

(51) Int. Cl.
  *B05D 5/06* (2006.01)
  *B05D 7/22* (2006.01)
(52) U.S. Cl. ........................... 427/66; 427/235; 313/512
(58) Field of Classification Search ................. 427/235, 427/66; 313/512
  See application file for complete search history.

(56) References Cited

U.S. PATENT DOCUMENTS

| 5,705,888 | A * | 1/1998 | Staring et al. ............... 313/503 |
| 6,538,375 | B1 * | 3/2003 | Duggal et al. ............... 313/506 |
| 6,885,144 | B2 | 4/2005 | Matsuo |
| 2002/0127833 | A1 * | 9/2002 | Izumi et al. .................. 438/597 |
| 2003/0141807 | A1 * | 7/2003 | Kawase ....................... 313/498 |
| 2003/0209973 | A1 * | 11/2003 | McCormick et al. ........ 313/504 |
| 2005/0073228 | A1 * | 4/2005 | Tyan et al. ................... 313/110 |

FOREIGN PATENT DOCUMENTS

| JP | 03-205185 | 9/1991 |
| JP | 07-155663 | 6/1995 |
| JP | 09-306356 | 11/1997 |
| JP | 11-265785 | 9/1999 |
| JP | 2001-052654 | 2/2001 |
| JP | 2003-142252 | 5/2003 |
| JP | 2004-237240 | 8/2004 |
| JP | 2004-303569 | 10/2004 |
| JP | 2005-108643 | 4/2005 |

* cited by examiner

*Primary Examiner*—Timothy H Meeks
*Assistant Examiner*—Jimmy Lin
(74) *Attorney, Agent, or Firm*—Harness, Dickey & Pierce, P.L.C.

(57) ABSTRACT

An electroluminescence device includes a tubular first electrode, an electroluminescence layer formed on an inner surface of the first electrode, and a second electrode formed on an inner surface of the electroluminescence layer. A method for manufacturing the electroluminescence device includes: conducting an electroluminescence layer forming liquid into and out of the inside of the first electrode, thereby forming a liquid film of the electroluminescence layer forming liquid on the inner surface of the first electrode; and forming the electroluminescence layer by drying the liquid film of the electroluminescence layer forming liquid formed on the inner surface of the first electrode. This facilitates modification of the size or the shape of the electroluminescence device and thus improves productivity for manufacturing the electroluminescence device.

8 Claims, 2 Drawing Sheets

METHOD FOR MANUFACTURING ELECTROLUMINESCENCE DEVICE

CROSS-REFERENCE TO RELATED APPLICATIONS

This application is based upon and claims the benefit of priority from prior Japanese Patent Application No. 2005-216342, filed on Jul. 26, 2005, the entire content of which is incorporated herein by reference.

BACKGROUND

The present invention relates to methods for manufacturing electroluminescence devices.

As typical bar-like light emission devices, fluorescent lights or neon tubes are known. The fluorescent lights and the neon tubes emit light through discharge phenomenon of noble gas sealed in a glass tube. However, the light emission devices that emit light through the discharge phenomenon are difficult to reduce in size and consume a relatively great amount of power. To solve these problems, a bar-like electroluminescence device (hereinafter, referred to simply as an "EL device") having an electroluminescence element (hereinafter, referred to simply as an "EL element") is focused on as a bar-like light emission device that is smaller and decreases power consumption. The EL element is provided on an outer circumferential surface of a bar-like member.

To manufacture the EL device, a wrapping method and a vapor deposition method are known (see, for example, Japanese Laid-Open Patent Publications Nos. 11-265785 and 2005-108643, respectively). In the wrapping method, a first electrode (an anode), an organic layer, and a second electrode (a cathode) are sequentially arranged on a flexible sheet substrate in this order. The sheet substrate is then wound around a support bar. In the vapor deposition method, an organic layer, an anode, and a seal layer are sequentially vapor-deposited on a bar-like cathode in this order.

However, in the wrapping method of Japanese Laid-Open Patent Publication No. 11-265785, the EL element formed on the sheet substrate must be bent when the sheet substrate is wound around the outer circumferential surface of the support bar. If the support bar becomes smaller, excessive compression stress or excessive extension stress acts on each of the layers that form the EL element, which is wound around the support bar. This may deteriorate the electric characteristics of each layer and decrease productivity for manufacturing the EL device.

In the vapor deposition method of Japanese Laid-Open Patent Publication No. 2005-108643, the layers are provided sequentially through deposition with increased directivity. Thus, if a relatively large EL device or a complicatedly configured EL device must be manufactured, formation of an organic layer or a cathode with uniform thickness becomes difficult. This significantly lowers the productivity for manufacturing the EL device.

SUMMARY

An advantage of some aspects of the present invention is to provide a method for manufacturing an electroluminescence device that facilitates modification of the size or the shape of the electroluminescence device and thus improves productivity for manufacturing the electroluminescence device.

According to an aspect of the present invention, a method for manufacturing an electroluminescence device is provided. The electroluminescence device includes an optically transparent tubular first electrode, an electroluminescence layer formed on an inner surface of the first electrode, and a second electrode formed on an inner surface of the electroluminescence layer. The method includes: conducting an electroluminescence layer forming liquid into and out of the inside of the first electrode, thereby forming a liquid film of the electroluminescence layer forming liquid on the inner surface of the first electrode; and forming the electroluminescence layer by drying the liquid film of the electroluminescence layer forming liquid formed on the inner surface of the first electrode.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EXEMPLARY EMBODIMENTS

Figure 1:
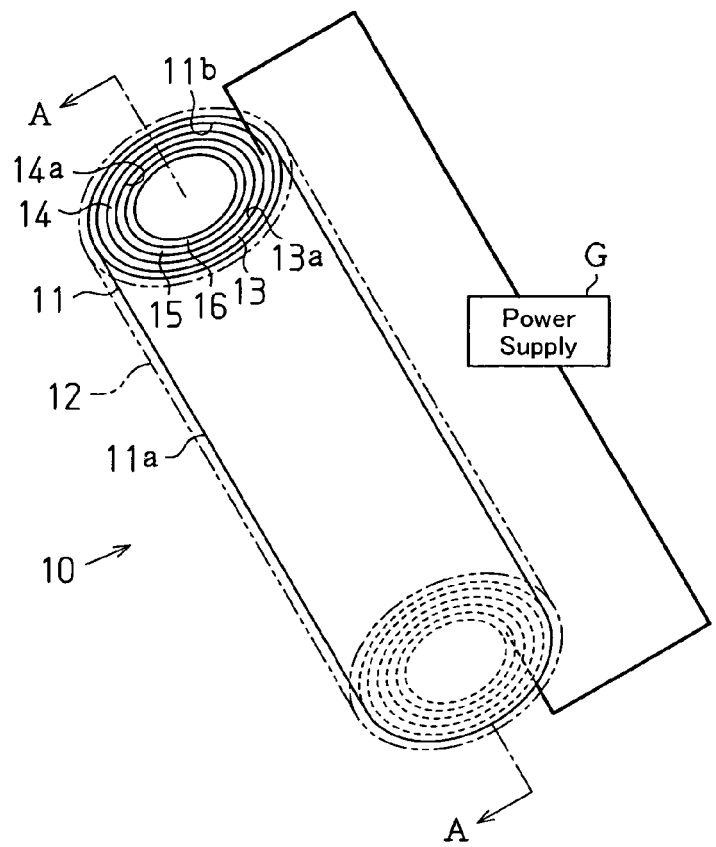
FIG. 1 is a perspective view schematically showing an electroluminescence device according to an embodiment of the present invention.
Figure 2:
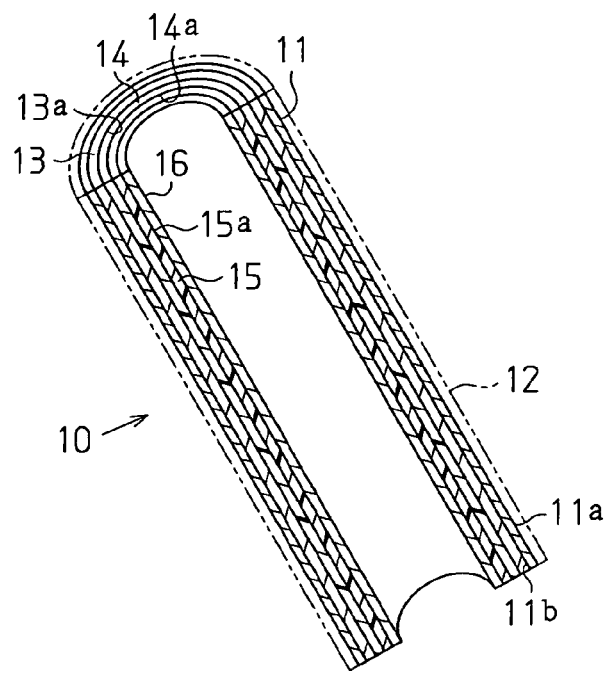
FIG. 2 is a cross-sectional view schematically showing the electroluminescence device.

An embodiment of the present invention will now be described with reference to FIGS. 1 to 6. FIG. 1 is a perspective view schematically showing an electroluminescence device (hereinafter, referred to simply as an "EL device"). FIG. 2 is a cross-sectional view taken along line A-A of FIG. 1.

As shown in FIG. 1, an EL device 10 has a tube 11, or a tubular member. The tube 11 has a circular cross-sectional shape and is formed of optically transparent insulating material. The tube 11 is formed of, for example, inorganic material such as different types of glasses or resin material such as polyethylene terephthalate, polyethylene naphthalate, polypropylene, and polymethylmethacrylate. In the illustrated embodiment, the inner diameter of the tube 11 is approximately 5 mm and the length of the tube 11 is approximately 200 mm. However, the dimensions of the tube 11 are not restricted to these values but may be altered to any other suitable values as long as different liquid films, which will be explained later, can be formed on an inner circumferential surface 11b of the tube 11.

As indicated by the double-dotted broken lines of FIGS. 1 and 2, a seal layer 12 is formed around an outer circumferential surface 11a of the tube 11. The seal layer 12 covers the entire tube 11. The seal layer 12 is formed of an optically transparent inorganic or organic high molecular film having a gas barrier property. The seal layer 12 thus prevents outside air containing water and oxygen from entering the interior of the tube 11.

An anode layer 13, or a first electrode, is provided on an inner surface (the inner circumferential surface 11b) of the tube 11. The anode layer 13 is an optically transparent anode with uniform thickness provided on the entire inner circumferential surface 11b of the tube 11. The anode layer 13 is formed of conductive material having a relatively great work function (anode layer material: for example, inorganic oxides such as ITO (Indium-Tin-Oxide), $SnO_2$, $SnO_2$ containing Sb, and ZnO containing Al or transparent conductive resin such as polythiophene and polypyrrole). The anode layer 13 is electrically connected to an end of a power supply G that supplies drive power to the EL device 10. The anode layer 13 thus injects holes into a hole transport layer 14, which will be described later.

The hole transport layer 14, which forms an electroluminescence layer (hereinafter, referred to simply as an "EL layer"), is formed on an inner surface (an inner circumferential surface 13a) of the anode layer 13. The hole transport layer 14 is an organic layer with uniform thickness formed on the entire inner circumferential surface 13a of the anode layer 13. In the illustrated embodiment, the thickness of the hole transport layer 14 is not particularly restricted. However, if the thickness of the hole transport layer 14 is excessively small, a pin hole may be caused. If the thickness of the hole transport layer 14 is excessively great, permeability of the hole transport layer 14 may lower and change chromaticity (hue) of the light emitted by a light emitting layer 15, which will be explained later. Therefore, the thickness of the hole transport layer 14 is preferably 10-150 nm, and, more preferably, 50-100 nm. The hole transport layer material that forms the hole transport layer 14 is formed of a conjugated organic compound. Through a property of the material brought about by the presence of electron clouds, the hole transport layer 14 is allowed to transport holes injected by the anode layer 13 to the light emitting layer 15, which will be discussed later.

In the illustrated embodiment, the hole transport layer material is poly(3,4-ethylene dioxythiophene) (hereinafter, referred to simply as "PEDOT"). However, as listed below, the different types of low molecular or high molecular hole transport layer materials may be employed independently or in combination of two or more materials.

The low molecular hole transport layer materials include, for example, benzidine derivatives, triphenylmethane derivatives, phenylenediamine derivatives, styrylamine derivatives, hydrazone derivatives, pyrazoline derivatives, carbazole derivatives, and porphyrin compounds.

The high molecular hole transport layer materials include high molecular compounds containing any of the above-listed low molecular structures (as a main chain or a side chain), polyaniline, polythiophenevinylene, polythiophene, α-naphthylphenyldiamine, mixtures of "PEDOT" and polystyrene sulfonate (Baytron P, trade mark of Bayer Corporation), and different types of dendrimers containing triphenylamine or ethylenediamine as molecular nuclei.

If any of the above-listed low molecular hole transport layer materials is employed, binder (a high molecular binder) may be added to the material as necessary. In this case, it is preferable to select a binder that does not excessively suppress charge transport and exhibits relatively low absorption rate of visible lights. Specifically, as the binder, one or more substances selected from polyethylene oxide, polyvinylidene fluoride, polycarbonate, polyacrylate, polymethyl acrylate, polymethyl methacrylate, polystyrene, polyvinyl chloride, and polysiloxane may be employed independently or in combination. Alternatively, any of the above-listed high molecular hole transport layer materials may be selected as the binder.

The light emitting layer 15, which forms the EL layer, is arranged on an inner surface (an inner circumferential surface 14a) of the hole transport layer 14. The light emitting layer 15 is an organic layer with uniform thickness formed on the entire inner circumferential surface 14a of the hole transport layer 14. The thickness of the light emitting layer 15 is not restricted to a particular range. However, the thickness of the light emitting layer 15 is preferably 10-150 nm, and, more preferably, to 50-100 nm. If the thickness of the light emitting layer 15 is set in these ranges, holes and electrons efficiently recombine. This further increases light emitting efficiency of the light emitting layer 15. The light emitting layer material that forms the light emitting layer 15 injects holes from the anode layer 13 and electrons from a cathode layer 16, which will be explained later, when voltage is supplied between the anode layer 13 and the cathode layer 16. When the holes and the electrons recombine, the light emitting layer 15 generates excitons (excitation elements) using the energy released through such recombining. When the excitons restore the ground states and release energy, the energy causes emission of fluorescence or phosphorescence (light emission).

In the illustrated embodiment, the light emitting layer material is fluorene-dithiophene copolymer (hereinafter, referred to simply as "F8T2"). However, as listed below, the different types of known low or high molecular light emitting layer materials may be employed independently or in combination of two or more materials.

The low molecular light emitting layer materials include, for example, cyclopentadiene derivatives, tetraphenylbutadiene derivatives, triphenylamine derivatives, oxadiazole derivatives, distyrylbenzene derivatives, thiophene cyclic compounds, pyridine cyclic compounds, perynone derivatives, perylene derivatives, coumarin derivatives, and metal complexes such as aluminum quinolinol complexes, benzoquinolinol beryllium complexes, benzoxazole zinc complexes, benzothiazole zinc complexes, azomethyl zinc complexes, porphyrin zinc complexes, and europium complexes.

The high molecular light emitting layer materials include, for example, polyparaphenylene vinylene derivatives, polyparaphenylene derivatives, polysilane derivatives, polyacetylene derivatives, polythiophene derivatives, polyvinyl carbazole, polyfluorenone derivatives, polyquinoxaline derivatives, polyvinylene styrene derivatives, copolymers formed from these derivatives, and different types of dendrimers including triphenylamine or ethylenediamine as molecular nuclei.

The cathode layer 16, or a second electrode, is formed on an inner surface (an inner circumferential surface 15a) of the light emitting layer 15. The cathode layer 16 is a cathode having uniform thickness provided on the entire inner circumferential surface 15a of the light emitting layer 15. The cathode layer 16 is formed of conductive material with a relatively small work function (metal elementary substances such as Li, Mg, Ca, Sr, La, Ce, Er, Eu, Sc, Y, Yb, Ag, Cu, Al, Cs, and Rb). The cathode layer 16 is electrically connected to the other end of the aforementioned power supply G. The cathode layer 16 thus injects electrons into the light emitting layer 15.

To improve stability of the cathode layer material, the material may be selected as alloy containing two or three elements of the above-described list. If alloy type cathode layer material is employed, it is preferred that alloy containing stable metal elements such as Ag, Al, and Cu, or, more specifically, alloy such as MgAg, AlLi, or CuLi, be selected. These alloys improve electron injection efficiency and stability of the cathode layer 16.

When the power supply G is actuated and voltage is supplied between the anode layer 13 and the cathode layer 16, holes move from the anode layer 13 to the light emitting layer 15 through the hole transport layer 14 and electrons move from the cathode layer 16 to the light emitting layer 15. The holes and the electrons thus recombine in the light emitting layer 15, releasing energy. Using the released energy, the light emitting layer 15 generates excitons (excitation elements). The light emitting layer 15 thus emits light through transition of the excitons to the ground state.

A method for manufacturing the EL device 10, which has been described so far, will hereafter be explained with reference to FIGS. 3 to 6.

Figure 3:
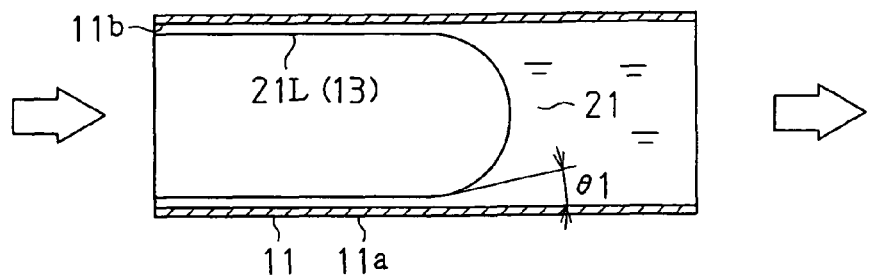
FIGS. 3 to 6 are views for explaining a method for manufacturing the electroluminescence device.

First, as illustrated in FIG. 3, anode layer forming liquid 21 is conducted into the tube 11 in a direction indicated by the arrows. In the illustrated embodiment, the anode layer forming liquid 21 is formed by dispersing nanoparticles of the aforementioned anode layer material, or "ITO", in organic dispersion medium. In order to facilitate formation of an anode layer liquid film 21L, which will be described later, it is preferred that the receding contact angle θ1 of the anode layer forming liquid 21 be adjusted to 45 degrees or less with respect to the inner circumferential surface 11b.

Subsequently, referring to FIG. 3, some of the anode layer forming liquid 21 is conducted out of the tube 11. This provides the anode layer liquid film 21L formed of the anode layer forming liquid 21 on the entire inner circumferential surface 11b of the tube 11. The thickness of the anode layer liquid film 21L depends on the receding contact angle θ1 and becomes uniform substantially over a substantially entire portion of the inner circumferential surface 11b.

After formation of the anode layer liquid film 21L, the tube 11 is transported to a drying-baking furnace. The tube 11 is thus heated sequentially to a predetermined drying temperature and a predetermined baking temperature, which are set in correspondence with the anode layer forming liquid 21. The anode layer liquid film 21L is thus dried and baked. In this manner, the anode layer 13 with uniform thickness is formed on the entire inner circumferential surface 11b of the tube 11 in correspondence with modification, if any, to the inner diameter or the length or the shape of the tube 11.

After the anode layer 13 has been provided through conduction of the anode layer forming liquid 21 into and out of the tube 11 and drying and baking of the anode layer liquid film 21L, as has been described, the thickness of the anode layer 13 may be less than a predetermined level. In this case, the above-described conduction of the anode layer forming liquid 21 into and out of the tube 11 and drying and baking of the anode layer liquid film 21L may be repeated in order to increase the thickness of the anode layer 13. Alternatively, the solvent or the dispersion medium of the anode layer forming liquid 21 may be modified in such a manner as to decrease the receding contact angle θ1, thus increasing the thickness of the anode layer liquid film 21L. Contrastingly, if the thickness of the anode layer 13, which has been formed through the conduction of the anode layer forming liquid 21 into and out of the tube 11 and the drying and baking of the anode layer liquid film 21L, exceeds the predetermined level, pressurized air may be blown into the tube 11 when the anode layer forming liquid 21 is conducted out of the tube 11. This increases the amount of the anode layer forming liquid 21 that is conducted out of the tube 11. The thickness of the anode layer liquid film 21L is thus decreased. Alternatively, the solvent or the dispersion medium of the anode layer forming liquid 21 may be changed in such a manner as to increase the receding contact angle θ1, thus reducing the thickness of the anode layer liquid film 21L.

Figure 4:
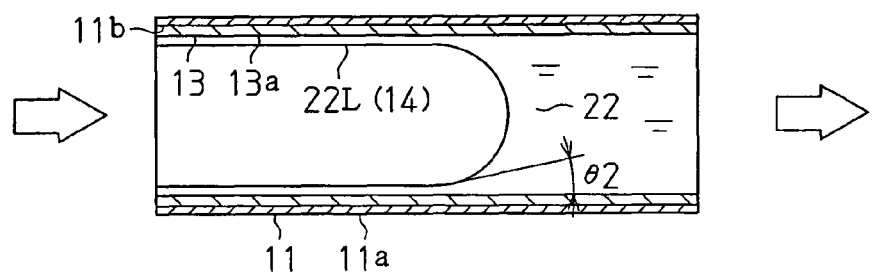

Following formation of the anode layer 13, a hole transport layer forming step is performed to provide the hole transport layer 14. Specifically, as illustrated in FIG. 4, hole transport layer forming liquid 22, which is electroluminescence layer forming liquid, is conducted into the tube 11 in a direction indicated by the arrows, until the tube 11 becomes full. In the illustrated embodiment, the hole transport layer forming liquid 22 is prepared by dissolving the aforementioned hole transport layer material "PEDOT" in water-based solvent (for example, water, lower alcohol such as methanol, or cellosolve solvent such as ethoxyethanol). In order to facilitate formation of a hole transport layer liquid film 22L, which will be described later, it is preferred that the receding contact angle θ2 of the hole transport layer forming liquid 22 be 45 degrees or less with respect to the inner circumferential surface 13a. However, the hole transport layer forming liquid 22 may be changed to liquid containing any of the above-listed low molecular hole transport layer materials and organic or inorganic solvent or dispersion medium that is set in correspondence with the hole transport layer material to be employed.

Next, referring to FIG. 4, some of the hole transport layer forming liquid 22 is conducted out of the tube 11. This provides a hole transport layer liquid film 22L formed of the hole transport layer forming liquid 22 on the entire inner circumferential surface 13a of the anode layer 13. The thickness of the hole transport layer liquid film 22L depends on the receding contact angle θ2 and becomes uniform over substantially the entire the inner circumferential surface 13a.

After having formed the hole transport layer liquid film 22L, the tube 11 is transported to a drying furnace. The tube 11 is thus heated to a predetermined drying temperature, which is set in correspondence with the hole transport layer forming liquid 22. The hole transport layer liquid film 22L is thus dried. In this manner, the hole transport layer 14 with uniform thickness is formed on the entire inner circumferential surface 13a of the anode layer 13 in correspondence with modification, if any, to the inner diameter or the length or the shape of the tube 11.

If the thickness of the hole transport layer 14, which has been formed through conduction of the hole transport layer forming liquid 22 into and out of the tube 11 and drying of the hole transport layer liquid film 22L as has been described, is less than a predetermined level, the above-described conduction of the hole transport layer forming liquid 22 into and out of the tube 11 and drying of the hole transport layer liquid film 22L may be repeated. This increases the thickness of the hole transport layer 14. Alternatively, the solvent or the dispersion medium of the hole transport layer forming liquid 22 may be modified in such a manner as to decrease the receding contact angle θ2, thus increasing the thickness of the hole transport layer liquid film 22L. Contrastingly, if the thickness of the hole transport layer 14, which has been provided through the conduction of the hole transport layer forming liquid 22 into and out of the tube 11 and the drying of the hole transport layer liquid film 22L, exceeds the predetermined level, pressurized air may be blown into the tube 11 when the hole transport layer forming liquid 22 is conducted out of the tube 11. This increases the amount of the hole transport layer forming liquid 22 that is conducted out of the tube 11. The thickness of the hole transport layer liquid film 22L is thus decreased. Alternatively, the solvent or the dispersion medium of the hole transport layer forming liquid 22 may be changed in such a manner as to increase the receding contact angle θ2, thus reducing the thickness of the hole transport layer liquid film 22L.

Figure 5:
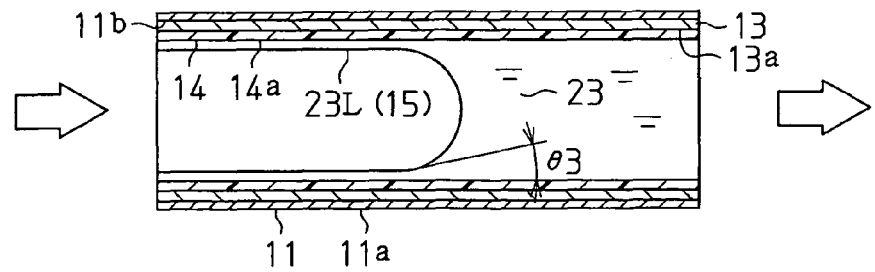

After having formed the hole transport layer 14 in the tube 11, a light emitting layer forming step is carried out for providing the light emitting layer 15. Specifically, as illustrated in FIG. 5, light emitting layer forming liquid 23 is conducted into the tube 11, which has the hole transport layer 14, in a direction indicated by the arrows until the tube 11 becomes full. In the illustrated embodiment, the light emitting layer forming liquid 23 is prepared by dissolving the aforementioned light emitting layer material "F8T2" in nonpolar organic solvent (such as benzene, toluene, xylene, cyclohexyl benzene, dihydrobenzofuran, trimethyl benzene, or tetramethyl benzene). In order to facilitate formation of a light emitting layer liquid film 23L, which will be described later, it is preferred that the receding contact angle θ3 of the light emitting layer forming liquid 23 be 45 degrees or less with respect to the inner circumferential surface 14a. However, the light emitting layer forming liquid 23 may be a liquid formed of any of the above-listed low molecular light emitting layer materials and organic or inorganic solvent or dispersion medium that is set in correspondence with the light emitting layer material to be employed.

Following conduction of the light emitting layer forming liquid 23 into the tube 11, referring to FIG. 5, some of the light emitting layer forming liquid 23 is conducted out of the tube 11. This provides the light emitting layer liquid film 23L formed of the light emitting layer forming liquid 23 on the entire inner circumferential surface 14a of the hole transport layer 14. The thickness of the light emitting layer liquid film 23L depends on the receding contact angle θ3 and becomes uniform over substantially the entire inner circumferential surface 14a.

After formation of the light emitting layer liquid film 23L, the tube 11 is transported to a drying furnace. The tube 11 is thus heated to a predetermined drying temperature, which is set in correspondence with the light emitting layer forming liquid 23, thus drying the light emitting layer liquid film 23L. In this manner, the light emitting layer 15 with uniform thickness is formed on the entire inner circumferential surface 14a of the hole transport layer 14 in correspondence with modification, if any, to the inner diameter or the length or the shape of the tube 11.

If the thickness of the light emitting layer 15, which has been formed through conduction of the light emitting layer forming liquid 23 into and out of the tube 11 and drying of the light emitting layer liquid film 23L as has been described, is less than a predetermined level, the above-described conduction of the light emitting layer forming liquid 23 into and out of the tube 11 and drying of the light emitting layer liquid film 23L may be repeated. This increases the thickness of the light emitting layer 15. Alternatively, the solvent or the dispersion medium of the light emitting layer forming liquid 23 may be modified in such a manner as to decrease the receding contact angle θ3, thus increasing the thickness of the light emitting layer liquid film 23L. Contrastingly, if the thickness of the light emitting layer 15, which has been formed through the conduction of the light emitting layer forming liquid 23 into and out of the tube 11 and the drying of the light emitting layer liquid film 23L, exceeds the predetermined level, pressurized air may be blown into the tube 11 when the light emitting layer forming liquid 23 is conducted out of the tube 11. This increases the amount of the light emitting layer forming liquid 23 that is conducted out of the tube 11. The thickness of the light emitting layer liquid film 23L is thus decreased. Alternatively, the solvent or the dispersion medium of the light emitting layer forming liquid 23 may be changed in such a manner as to increase the receding contact angle θ3, thus reducing the thickness of the light emitting layer liquid film 23L.

Figure 6:
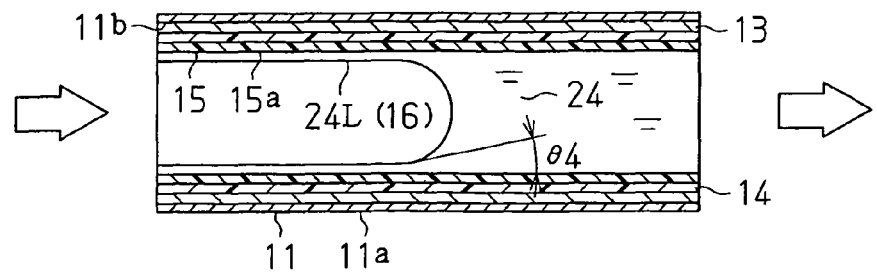

After formation of the light emitting layer 15 in the tube 11, as illustrated in FIG. 6, cathode layer forming liquid 24, or second electrode forming liquid, is conducted into the tube 11 having the light emitting layer 15 in a direction indicated by the arrows, until the tube 11 becomes full. In the illustrated embodiment, the cathode layer forming liquid 24 is prepared by dispersing nanoparticles of silver of the aforementioned cathode layer material in organic dispersion medium. In order to facilitate formation of a cathode layer liquid film 24L, which will be described later, it is preferred that the receding contact angle θ4 of the cathode layer forming liquid 24 be adjusted to 45 degrees or less with respect to the inner circumferential surface 15a.

Following conduction of the cathode layer forming liquid 24 into the tube 11, referring to FIG. 6, some of the cathode layer forming liquid 24 is conducted out of the tube 11. This provides the cathode layer liquid film 24L formed of the cathode layer forming liquid 24 on the entire inner circumferential surface 15a of the light emitting layer 15. The thickness of the cathode layer liquid film 24L depends on the receding contact angle θ4 and becomes uniform over substantially the entire inner circumferential surface 15a.

After having formed the cathode layer liquid film 24L, the tube 11 is transported to a drying furnace. The tube 11 is thus heated to a predetermined drying temperature, which is set in correspondence with the cathode layer forming liquid 24, thus drying the cathode layer liquid film 24L. In this manner, the cathode layer 16 with uniform thickness is formed on the entire inner circumferential surface 15a of the light emitting layer 15 in correspondence with modification, if any, to the inner diameter or the length or the shape of the tube 11.

If the thickness of the cathode layer 16, which has been formed through conduction of the cathode layer forming liquid 24 into and out of the tube 11 and drying of the cathode layer liquid film 24L as has been described, is less than a predetermined level, the above-described conduction of the cathode layer forming liquid 24 into and out of the tube 11 and drying of the cathode layer liquid film 24L may be repeated. This increases the thickness of the cathode layer 16. Alternatively, the solvent or the dispersion medium of the cathode layer forming liquid 24 may be modified in such a manner as to decrease the receding contact angle θ4, thus increasing the thickness of the cathode layer liquid film 24L. Contrastingly, if the thickness of the cathode layer 16, which has been formed through the conduction of the cathode layer forming liquid 24 into and out of the tube 11 and the drying of the cathode layer liquid film 24L, exceeds the predetermined level, pressurized air may be blasted into the tube 11 when the cathode layer forming liquid 24 is conducted out of the tube 11. This increases the amount of the cathode layer forming liquid 24 that is conducted out of the tube 11. The thickness of the cathode layer liquid film 24L is thus decreased. Alternatively, the solvent or the dispersion medium of the cathode layer forming liquid 24 may be changed in such a manner as to increase the receding contact angle θ4, thus reducing the thickness of the cathode layer liquid film 24L.

After formation of the cathode layer 16 in the tube 11, a seal layer 12, which is a high molecular film having a gas barrier property, is applied onto and formed on the entire tube 11. At this stage, a portion of the anode layer 13 and a portion of the cathode layer 16 are masked to provide a non-illustrated connection area in each of the masked portions of the anode layer 13 and the cathode layer 16 through which the anode layer 13 or the cathode layer 16 is connected to the power supply G.

Accordingly, the anode layer 13, the hole transport layer 14, the light emitting layer 15, and the cathode layer 16 are each formed with uniform thickness on the entire inner circumferential surface 11b of the tube 11, in correspondence with modification, if any, to the inner diameter or the length or the shape of the tube 11.

The illustrated embodiment has the following advantages.

(1) In the illustrated embodiment, the hole transport layer forming liquid 22 containing the hole transport layer material is conducted into and out of the tube 11 having the anode layer 13. The hole transport layer liquid film 22L having uniform thickness is thus formed on the entire inner circumferential surface 13a of the anode layer 13, which has been formed on the inner circumferential surface 11b. The hole transport layer liquid film 22L is then dried to form the hole transport layer 14 on the entire inner circumferential surface 13a of the anode layer 13. Further, the light emitting layer forming liquid 23 containing the light emitting layer material is conducted into and out of the tube 11 having the hole transport layer 14. This provides the light emitting layer liquid film 23L having uniform thickness on the entire inner circumferential surface 14a of the hole transport layer 14. The light emitting layer liquid film 23L is then dried to form the light emitting layer 15 having uniform thickness on the entire inner circumferential surface 14a of the hole transport layer 14.

Accordingly, through conduction of the hole transport layer forming liquid 22 and the light emitting layer forming liquid 23 into and out of the tube 11, the hole transport layer 14 and the light emitting layer 15, respectively, are provided with uniform thicknesses set in correspondence with the diameter or the length of the tube 11. The hole transport layer 14 and the light emitting layer 15 are thus formed in correspondence with modification to the size or the shape of the tube 11. This increases productivity for manufacturing the EL device 10.

(2) In the illustrated embodiment, through conduction of the anode layer forming liquid 21 and the cathode layer forming liquid 24 into and out of the tube 11, the anode layer liquid film 21L and the cathode layer liquid film 24L are formed, respectively. The anode layer liquid film 21L and the cathode layer liquid film 24L are dried or dried and baked to provide the anode layer 13 and the cathode layer 16, respectively.

Accordingly, through conduction of the anode layer forming liquid 21 and the cathode layer forming liquid 24 into and out of the tube 11, the anode layer 13 and the cathode layer 16, respectively, are provided with uniform thicknesses set in correspondence with the diameter or the length of the tube 11. The anode layer 13 and the cathode layer 16 are thus formed in correspondence with modification to the size or the shape of the tube 11. This increases productivity for manufacturing the EL device 10.

(3) In the illustrated embodiment, the seal layer 12 is formed on the outer circumferential surface 11a of the tube 11. The outside air containing water and oxygen is thus prevented from entering the hole transport layer 14 and the light emitting layer 15. This suppresses deterioration of the hole transport layer 14 and the light emitting layer 15 as time elapses.

The illustrated embodiment may be modified as follows.

In the illustrated embodiment, the tube 11 has a circular cross-sectional shape and a bar-like outline. However, the tube 11 may have an oval or rectangular cross-sectional shape or a spirally curved outline. In other words, as long as different liquids such as the hole transport layer forming liquid 22 or the light emitting layer forming liquid 23 can be conducted into the tube 11, the tube 11 may be shaped in any other suitable manner.

Although the tube 11 is formed of optically transparent insulating material in the illustrated embodiment, the tube 11 may be formed of optically transparent conductive material, or anode layer material. This makes it unnecessary to separately provide the anode layer 13 on the inner circumferential surface 11b of the tube 11. The step of forming the anode layer 13 can thus be omitted. Further, the productivity for manufacturing the EL device 10 improves.

In the illustrated embodiment, the anode layer 13 is formed of the anode layer forming liquid 21 formed of the ITO nanoparticles. However, for example, a mixture of indium nitrate and anhydrous stannic chloride containing n-butyl carbitol as solvent may be conducted into and out of the tube 11. The anode layer 13 is thus formed of ITO. Alternatively, paste of tin oxide or indium oxide may be applied onto and dried on the inner circumferential surface 11b, thus providing the anode layer 13 formed of tin oxide or indium oxide.

In the illustrated embodiment, the optically transparent anode layer 13 is formed on the inner circumferential surface 11b of the tube 11. Then, the hole transport layer 14, the light emitting layer 15, and the cathode layer 16 are provided sequentially. However, the optically transparent cathode layer 16 may be formed on the inner circumferential surface 11b of the tube 11. The light emitting layer 15, the hole transport layer 14, and the anode layer 13 are then provided sequentially. In this case, the anode layer 13 may be formed using metal such as gold, platinum, palladium, or nickel or a semiconductor with a relatively great work function such as silicon, gallium-phosphorus, or amorphous silicon carbide. The listed materials may be used independently or in combination of two or more materials as the material of the anode layer 13. Alternatively, the anode layer 13 may be formed of conductive resin material such as polythiophene or polypyrrole.

In the illustrated embodiment, the anode layer forming liquid 21 and the cathode layer forming liquid 24 are conducted into and out of the tube 11, thus forming the anode layer 13 and the cathode layer 16, respectively. However, gaseous anode layer material and gaseous cathode layer material may be supplied into the tube 11. In this case, the anode layer 13 and the cathode layer 16 are each formed through vapor deposition. That is, any other suitable method may be employed as long as the anode layer 13 and the cathode layer 16 are provided substantially on the entire inner circumferential surface 11b, 15a.

In the illustrated embodiment, the light emitting layer material is an organic high molecular material or an organic low molecular material. However, the light emitting layer material may be formed of an inorganic molecular substance such as ZnS/CuCl, ZnS/CuBr, or ZnCdS/CuBr. In this case, it is preferred that the light emitting layer forming liquid 23 be prepared by dispersing the light emitting layer material in organic binder. The organic binder may be a cyanoethylate of polysaccharide such as cyanoethyl cellulose, cyanoethyl starch, or cyanoethyl pullulan or a cyanoethylate of a polysaccharide derivative such as cyanoethyl hydroxyethyl cellulose or cyanoethyl glycerol pullulan or a cyanoethylate of polyol such as cyanoethyl polyvinyl alcohol.

In the illustrated embodiment, the light emitting layer 15 is formed on the inner circumferential surface 11b of the tube 11 as a single layer. However, a multi-photon structure may be employed. Specifically, a plurality of units each including the light emitting layer 15 and a charge generating layer may be provided between the anode layer 13 and the cathode layer 16.

The hole transport layer 14 is formed on the inner circumferential surface 13a of the anode layer 13. However, for example, the hole transport layer 14 may be omitted. Alternatively, a hole injection layer may be arranged between the anode layer 13 and the hole transport layer 14. The hole injection layer improves efficiency for injecting holes into the light emitting layer 15.

In the illustrated embodiment, the light emitting layer 15 is formed on the inner circumferential surface 14a of the hole transport layer 14. However, for example, an electron barrier layer, which suppresses movement of electrons, may be arranged between the hole transport layer 14 and the light emitting layer 15.

In the illustrated embodiment, the cathode layer 16 is formed on the inner circumferential surface 15a of the light emitting layer 15. However, for example, an electron transport layer may be formed between the light emitting layer 15 and the cathode layer 16. The electron transport layer transports the electrons injected from the cathode layer 16 to the light emitting layer 15. Alternatively, a hole barrier layer that suppresses movement of holes may be arranged between the light emitting layer 15 and the electron transport layer.

What is claimed is:

1. A method for manufacturing an electroluminescence device, the electroluminescence device including an optically transparent straight tubular first electrode having a first end and a second end, an electroluminescence layer formed on an inner surface of the first electrode, and a second electrode formed on an inner surface of the electroluminescent layer, wherein the first end and the second end have a circular shape, the method comprising:
   conducting an electroluminescence layer forming liquid into an inside of the first electrode from the first end to bring the electroluminescence layer forming liquid into contact with the inner surface of the first electrode, and then conducting the electroluminescence layer forming liquid out of the inside of the first electrode from the second end, thereby forming a liquid film of the electroluminescence layer forming liquid on the inner surface of the first electrode; and
   forming the electroluminescence layer by drying the liquid film of the electroluminescence layer forming liquid formed on the inner surface of the first electrode.

2. The method according to claim 1, further comprising:
   conducting a second electrode forming liquid into and out of an inside of the electroluminescence layer, thereby forming a liquid film of the second electrode forming liquid on an inner surface of the electroluminescence layer; and
   forming the second electrode by drying the liquid film of the second electrode forming liquid formed on the inner surface of the electroluminescence layer.

3. The method according to claim 1, further comprising:
   conducting a first electrode forming liquid into and out of an inside of an optically transparent tubular member, thereby forming a liquid film of a first electrode forming liquid on the inner surface of the tubular member; and
   forming the first electrode by drying the liquid film of the first electrode forming liquid formed on the inner surface of the tubular member.

4. The method according to claim 1, further comprising forming a seal layer on an outer surface of the first electrode, the seal layer preventing outside air from entering the electroluminescence layer.

5. The method according to claim 1, wherein a receding contact angle of the electroluminescence layer forming liquid relative to the inner surface of the first electrode is 45 degrees or less.

6. The method according to claim 1, wherein the electroluminescence layer includes a hole transport layer formed on the inner surface of the first electrode, and a light emitting layer formed on the inner surface of the hole transport layer, the forming of the electroluminescence layer including:
   conducting a hole transport layer forming liquid into and out of the inside of the first electrode, thereby forming a liquid film of the hole transport layer forming liquid on the inner surface of the first electrode;
   forming the hole transport layer by drying the liquid film of the hole transport layer forming liquid formed on the inner surface of the first electrode;
   conducting a light emitting layer forming liquid into and out of an inside of the obtained hole transport layer, thereby forming a liquid film of the light emitting layer forming liquid on an inner surface of the hole transport layer; and
   forming the light emitting layer by drying the liquid film of the light emitting layer forming liquid formed on the inner surface of the hole transport layer.

7. The method according to claim 1, wherein the electroluminescence layer includes a light emitting layer formed on the inner surface of the first electrode, and a hole transport layer formed on the inner surface of the light emitting layer, the forming of the electroluminescence layer including:
   conducting a light emitting layer forming liquid into and out of the inside of the first electrode, thereby forming a liquid film of the light emitting layer forming liquid on the inner surface of the first electrode;
   forming the light emitting layer by drying the liquid film of the light emitting layer forming liquid formed on the inner surface of the first electrode;
   conducting a hole transport layer forming liquid into and out of an inside of the obtained light emitting layer, thereby forming a liquid film of the hole transport layer forming liquid on an inner surface of the light emitting layer; and
   forming the hole transport layer by drying the liquid film of the hole transport layer forming liquid formed on the inner surface of the light emitting layer.

8. A method for manufacturing an electroluminescence device, the electroluminescence device including an optically transparent straight tubular member, a first electrode formed on an inner surface of the tubular member, the first electrode having a first end and a second end, an electroluminescence layer formed on an inner surface of the first electrode, and a second electrode formed on an inner surface of the electroluminescent layer, wherein the first end and the second end have a circular shape, the method comprising:
   conducting a first electrode forming liquid into and out of an inside of the tubular member, thereby forming a liquid film of the first electrode forming liquid on the inner surface of the tubular member;
   forming the first electrode by drying the liquid film of the first electrode forming liquid formed on the inner surface of the tubular member,
   conducting an electroluminescence layer forming liquid into an inside of the obtained first electrode from the first end to bring the electroluminescence layer forming liquid into contact with the inner surface of the first electrode, and then conducting the electroluminescence layer forming liquid out of the inside of the first electrode from the second end, thereby forming a liquid film of the electroluminescence layer forming liquid on the inner surface of the first electrode;
   forming the electroluminescence layer by drying the liquid film of the electroluminescence layer forming liquid formed on the inner surface of the first electrode;
   conducting a second electrode forming liquid into and out of an inside of the obtained electroluminescence layer, thereby forming a liquid film of the second electrode forming liquid on the inner surface of the electroluminescence layer; and
   forming the second electrode by drying the liquid film of the second electrode forming liquid formed on the inner surface of the electroluminescence layer.

* * * * *